(12) United States Patent
Morisson

(10) Patent No.: US 7,965,110 B2
(45) Date of Patent: Jun. 21, 2011

(54) SAMPLER BLOCKER PROTECTED AGAINST SWITCHING PARASITES

(75) Inventor: Richard Morisson, Grenoble (FR)

(73) Assignee: E2V Semiconductors (FR)

( * ) Notice: Subject to any disclaimer, the term of this patent is extended or adjusted under 35 U.S.C. 154(b) by 0 days.

(21) Appl. No.: 12/530,583

(22) PCT Filed: Mar. 3, 2008

(86) PCT No.: PCT/EP2008/052574
§ 371 (c)(1),
(2), (4) Date: Sep. 18, 2009

(87) PCT Pub. No.: WO2008/113675
PCT Pub. Date: Sep. 25, 2008

(65) Prior Publication Data
US 2010/0109710 A1    May 6, 2010

(30) Foreign Application Priority Data

Mar. 13, 2007 (FR) .................................. 07 01800

(51) Int. Cl.
H03K 17/00 (2006.01)
(52) U.S. Cl. ............... 327/94; 327/52; 327/53; 327/96; 330/252; 330/260

(58) Field of Classification Search ............... 327/53, 327/54, 63, 65, 91–96; 330/252, 257, 260
See application file for complete search history.

(56) References Cited

U.S. PATENT DOCUMENTS 5,457,418 A * 10/1995 Chang ......................... 327/374
2005/0035791 A1   2/2005 Devendorf et al.

FOREIGN PATENT DOCUMENTS

| EP | 1 074 996 | 2/2001 |
| WO | 01/73789 | 10/2001 |

* cited by examiner

Primary Examiner — Lincoln Donovan
Assistant Examiner — Shikha Goyal
(74) Attorney, Agent, or Firm — Lowe Hauptman Ham & Berner, LLP

(57) ABSTRACT

The invention relates to sample-and hold modules, and notably those which are intended to be placed upstream of an analog-digital converter. The sample-and-hold module conventionally comprises a differential pair of transistors, a follower transistor and a storage capacitor. The follower transistor is turned on during a sampling phase by the application of an emitter current by means of a first current switch and can be disabled during a hold phase by the application of a disabling voltage to its base. The sample-and-hold module operates according to the invention with a hold phase beginning at the same time as the end of a sampling phase and terminating before the start of a new sampling phase. Switching spikes are thus avoided at the transition between the end of a hold phase and the start of a new sampling phase.

10 Claims, 5 Drawing Sheets

SAMPLER BLOCKER PROTECTED AGAINST SWITCHING PARASITES

CROSS-REFERENCE TO RELATED APPLICATIONS

The present Application is based on International Application No. PCT/EP2008/052574, filed on Mar. 3, 2008, which in turn corresponds to French Application No. 07 01800, filed on Mar. 13, 2007, and priority is hereby claimed under 35 USC §119 based on these applications. Each of these applications are hereby incorporated by reference in their entirety into the present application.

FIELD OF THE INVENTION

The invention relates to sample-and-hold modules, notably those which are intended to be placed upstream of an analog-digital converter.

BACKGROUND OF THE INVENTION

A sample-and-hold module operates periodically, under the control of a clock, according to two alternating phases: the first phase is the sampling phase during which a voltage level of an input signal (notably an analog signal that one wishes to convert into digital) is stored in a storage capacitor; the second phase is the hold phase, during which the sampled voltage, that is to say the voltage stored in the capacitor, is maintained at its value, doing so for the entire time necessary for the operations done downstream of the sample-and-hold module. Typically, in an application to an analog-digital converter, it is known that the analog-digital conversion operation takes a certain time and the hold phase maintains the sampled voltage level throughout the entire time necessary for the conversion, before passing to a following sampling phase and to a following conversion.

Among the qualities expected of a sample-and-hold module, there is notably speed of operation, accurate copying of the input voltage into the storage capacitor, and lossless conservation of the voltage stored in the storage capacitor for the duration of the hold time.

FIG. 1 represents a sample-and-hold module of the prior art which exhibits good characteristics from this point of view but which has been found to possibly exhibit a troublesome defect to which we will return later.

The sampler of FIG. 1 is intended to sample an input voltage $V_{in}$. It essentially comprises a pair of differential branches forming a unit-gain buffer amplifier intended to avoid unnecessarily loading the upstream circuit which produces the voltage $V_{in}$. The differential pair comprises two identical transistors T1 and T2 whose emitters are joined and linked to a constant current source (of value $2.I_0$), the base of the transistor T1 receiving the voltage $V_{in}$. The collector of the transistor T1 is linked to a supply voltage Vcc. The collector of the transistor T2 is supplied by this voltage Vcc but through a current source which imposes a current $I_0$ (half of the former) in the transistor T2. The transistor T2 is arranged as a diode, that is to say its collector is linked to its base.

This arrangement permits the voltage on the base of T2 to reproduce the input voltage $V_{in}$ exactly. Indeed, the current in the collector of T1 is equal to $I_0$, like that of T2, since the current $2.I_0$ is shared between a current $I_0$ in T2 and a complementary current $2I_0-I_0$ in T1. The base-emitter voltages are therefore the same and the base voltage of T2 takes the value of that of T1.

The base of the transistor T2 is connected to the base of a follower transistor T3 which has two functions depending on whether the sampler is in sampling mode or in hold mode.

In sampling mode, the transistor T3 is biased as a voltage follower by a transistor T4 which applies an outgoing current to its emitter. Its emitter voltage then follows the variations of its base voltage, with an offset of a base-emitter voltage Vbe. The emitter of T3 is linked to the storage capacitor $C_{ech}$ and this capacitor therefore takes the value of $V_{in}$ to within the offset Vbe. The offset is constant and therefore it does not pose a problem; it poses still less of a problem in a differential system where a differential voltage $V_{in+}-V_{in-}$ would be sampled with two assemblies like that of FIG. 1; the output voltage is then the difference between the voltages stored on the capacitors; the offset Vbe disappears in this subtraction.

In hold mode, the transistor T3 is disabled by a transistor T5 which lowers the base potential of T3 and tends to extract a negative current from its base.

The transistor T4 and the transistor T5 are turned on alternately by complementary clock signals HE (which turns on T5) and HB (which turns on T4); these complementary signals define the sampling phase and the hold phase respectively.

Finally, a hold maintaining circuit, CLMP, applies to the base of the transistor T3, during the hold phase, a voltage which substantially copies over the voltage present on the storage capacitor, so that the base-emitter voltage of T3 remains in the vicinity of zero during the hold phase. It thus prevents the base-emitter voltage of T3 from descending too low, which would tend to saturate the transistor T5, slowing down the return to the sampling mode; it also maintains a base-emitter voltage of T3 constant, independent of the input voltage $V_{in}$.

The output of the sampler is tapped off from the capacitor $C_{ech}$, preferably after a buffer amplifier AMP of unit gain and high input impedance.

FIG. 2 represents a chart of the signals observed during the operation of the sample-and-hold module under the assumption that the signal $V_{in}$ to be converted is nearly sinusoidal. The clock signal HB is visible in the central part of the chart. The signal HB is the complement of the signal HE. The voltage $V_{ech}$ across the terminals of the storage capacitor is visible in the lower part of FIG. 2. During the sampling phases (HE at the high level, HB at the low level, the voltage $V_{ech}$ follows the evolution of the voltage $V_{in}$. During the hold phase (HE at the low level, HB at the high level), the voltage $V_{ech}$ remains pegged at the value that it had at the end of the sampling period.

However, very significant negative transition spikes are also observed at the end of the hold period, before the voltage $V_{ech}$ starts to follow the evolution of the voltage $V_{in}$ again. These spikes do not prevent the basic operation of the sample-and-hold module: throughout the hold phase, the voltage level $V_{ech}$ is stable and the circuits which are downstream (for example an analog-digital converter) can use it. However, if they are of too significant an amplitude, they may have an effect on these downstream circuits: for example, if a differential amplifier such as AMP is placed directly downstream, it may be saturated by the negative spike, the effect of this being to greatly slow down the re-establishment of its output voltage at the time of the sampling phase. At high frequency, the amplifier runs the risk of not being able to follow the variations of $V_{in}$ because of its recovery time, and the sampling voltage $V_{ech}$ will not be correct.

It has been found that these switching spikes could be due mainly to the fact that, when passing to the sampling phase, the transistor T3 turns on more quickly than the transistor T2:

both were disabled by the turning on of the transistor T5; they turn on as a result of the disabling of the transistor T5 and, as regards the transistor T3, as a result of the turning on of the transistor T4. The disabling voltage present on the base of T3, applied by the hold maintaining circuit CLMP, is also found on the sampling capacitor and produces a negative spike since, as has been seen, this voltage is always lower than that of the sampling capacitor. This spike disappears as soon as the base of the transistor T3 takes the new value of the input voltage $V_{in}$.

SUMMARY OF THE INVENTION

The aim of the invention is to propose a circuit which as far as possible prevents the presence of such transition spikes when passing from the hold phase to the sampling phase.

To achieve this, the invention proposes a sample-and-hold module comprising a differential pair of transistors constituting a unit-gain amplifier receiving an input voltage to be sampled, the differential pair being able to be supplied with current by a current source, a follower transistor linked between the output of the differential pair and a storage capacitor, this transistor being turned on during a sampling phase by the application of an emitter current by means of a first current switch and it being possible for it to be disabled during a hold phase by the application of a disabling voltage to its base, characterized in that the first current switch is controlled so as to permit the application of the emitter current to the follower transistor with an offset after the end of the application of the base disabling voltage.

In other words, there is now a sampling phase and a hold phase which are not exactly complementary when switching from the hold phase to the sampling phase. The hold phase, defined here as being the phase of applying a disabling voltage to the base of the follower transistor, can begin at the same time as the end of the sampling phase, defined here as being the phase of applying an emitter current to the follower transistor; but the hold phase now terminates before the start of the sampling phase, whereas in the prior art, the end of the hold phase and the start of the sampling phase were simultaneous.

Preferably, the sample-and-hold module comprises a second current switch which steers the current from the current source either towards the differential pair, outside of the hold phase, or towards the base of the follower transistor, during the hold phase.

The sample-and-hold module according to the invention can be embodied in the following manner: the differential pair comprises a first transistor whose base receives the voltage to be sampled and a second transistor whose base is linked to its collector, the joined base and collector constituting the output of the differential pair; this output is linked to the base of the follower transistor, the emitter of the follower transistor being linked to the storage capacitor.

The first current switch preferably comprises a second differential pair of transistors supplied by a second current source, one of the transistors of the second pair, linked to the emitter of the follower transistor, being turned on by a sampling signal defining the sampling phase, and the other transistor being turned on by a signal complementary to the sampling signal.

The second current switch is preferably constituted on the basis of a third differential pair of transistors supplied by the first current source, one of the transistors of the third pair being linked to the base of the follower transistor and being turned on by a hold signal defining the hold phase, the other transistor of the third pair being linked to the first pair so as to supply it with current and being turned on by a signal complementary to the hold signal.

As in the prior art, provision may be made furthermore for a hold maintaining circuit whose input is linked to the sampling capacitor and whose output applies to the base of the follower transistor, during the hold phase, a lower voltage than the voltage present on the storage capacitor.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DESCRIPTION OF PREFERRED EMBODIMENTS

The invention will be described in regard to circuits with NPN bipolar transistors; it is transposable to circuits with PNP transistors and can also be adapted to circuits with NMOS or PMOS transistors.

Figure 1:
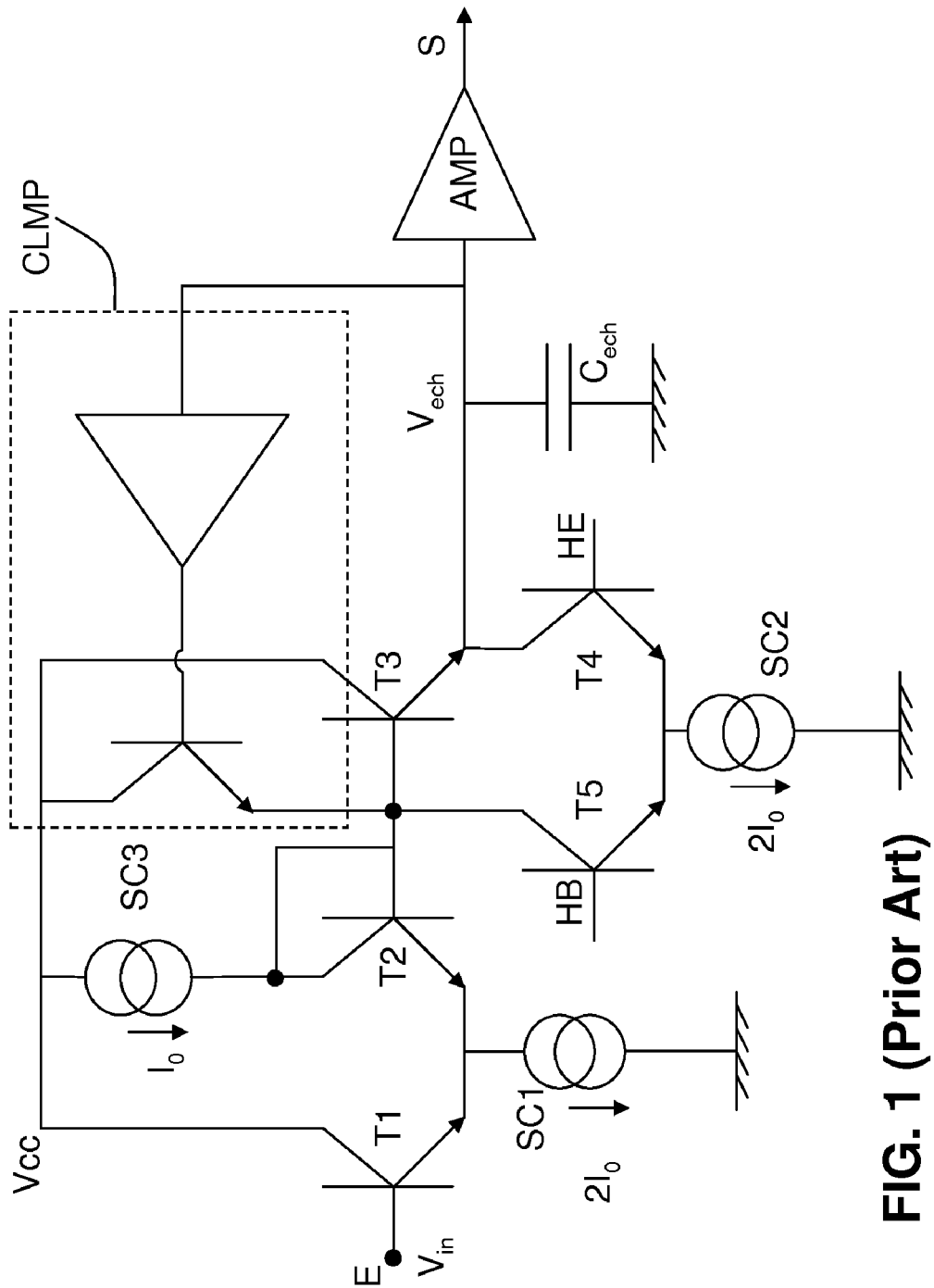
FIG. 1 represents a sample-and-hold module of the prior art.
Figure 3:
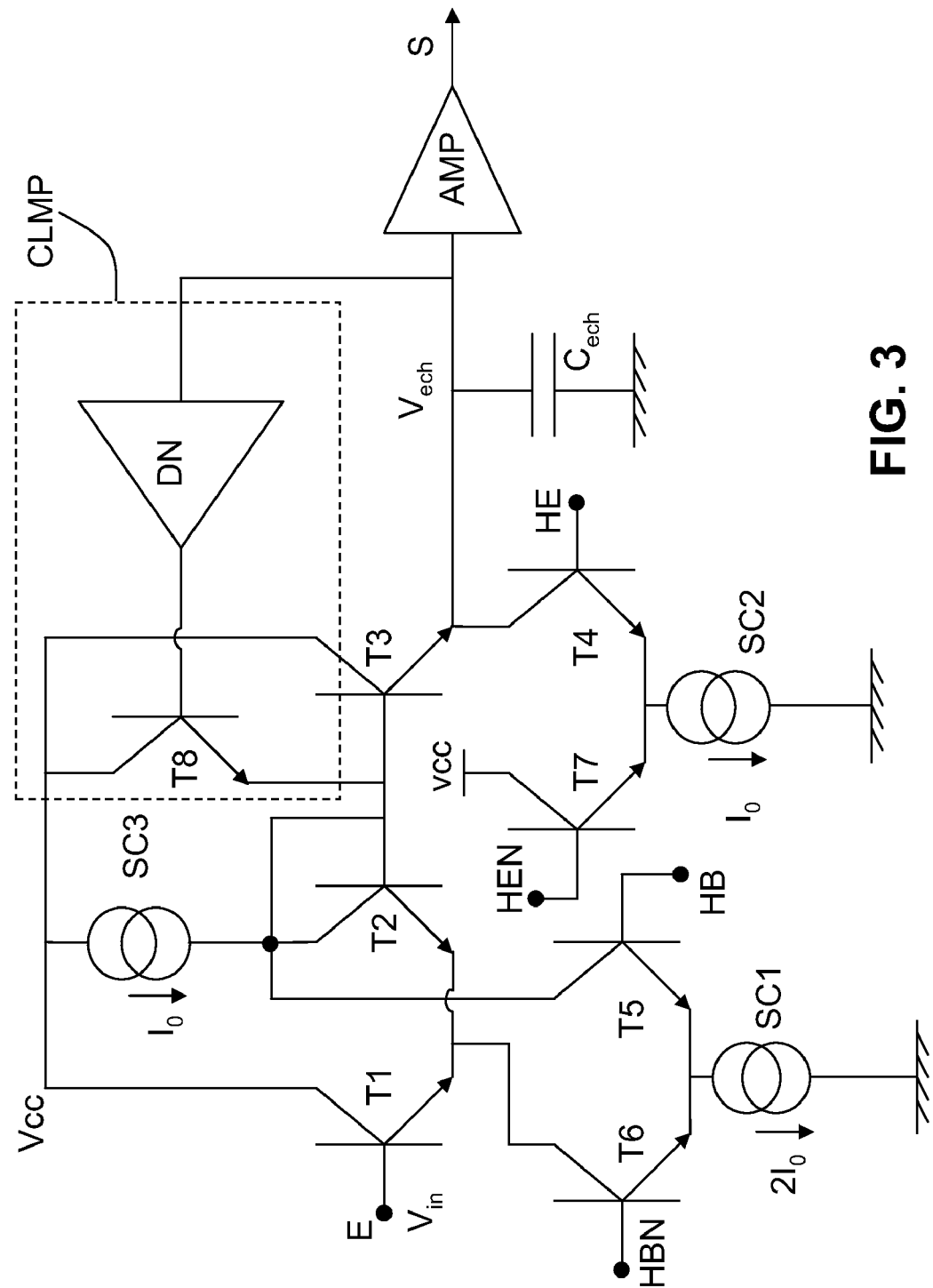
FIG. 3 represents a sample-and-hold module diagram according to the invention.

FIG. 3 represents the sample-and-hold module diagram according to the invention. The elements corresponding to those of FIG. 1 bear the same references. The diagram is that of a simple sample-and-hold module; it is easily transposable to a differential sample-and-hold module, by simple duplication.

The voltage $V_{in}$ to be sampled is applied to the input E of an amplifier with unit gain comprising a first differential pair of two transistors T1 and T2 having their emitters joined. The input E is the base of the transistor T1. The output of the amplifier is the base of the transistor T2, which is linked to its collector. The differential pair is supplied with current by a constant current source SC1 of value $2.I_0$, but this current supply is only provided, as will be seen, outside of the hold phases of the sample-and-hold module.

The collector of T1 is linked to a supply voltage Vcc. The collector and the base of T2 are linked to this supply voltage Vcc by way of a current source SC3 which imposes a current of value $I_0$ (half the value of the source SC1) between the power supply Vcc and the transistor T2.

The transistors T1 and T2 are identical. If the differential pair is supplied by the current $2.I_0$, outside of the hold phases, the current is divided into two equal parts in T2 (current $I_0$ imposed by the current source SC3) and in T1 (current resulting from the difference between the current $2.I_0$ in the source SC3 and the current $I_0$ in the transistor T2). The currents in T1 and T2 being identical, the base-emitter voltages of T1 and T2 are identical. The voltage on the base of the transistor T2 therefore takes the value $V_{in}$, outside of the hold phases.

The joined base and collector of the transistor T2, which constitute the output of the unit-gain amplifier, are linked to the input of a voltage follower stage. The follower stage consists of a transistor T3; the base of T3 is the input of the follower stage; the emitter of T3 is the output of the follower stage. This output is connected to a storage capacitor $C_{ech}$ whose function is to receive charges representing the value of $V_{in}$ during a sampling phase, and to preserve these charges without losses during a hold phase.

The role of the follower stage (T3) during the sampling phase is to transmit to the capacitor a voltage which represents the input voltage $V_{in}$ as exactly as possible. Nevertheless, the input voltage is transmitted to the capacitor with an offset of Vbe where Vbe is the base-emitter voltage of the transistor T3. This offset is not troublesome insofar as it is constant (the current which crosses T3 during the sampling phase is constant), and it is still less troublesome in a differential sample-and-hold module removing the common-mode effects.

The voltage across the terminals of the capacitor is $V_{ech}$. It follows the voltage $V_{in}$ during the sampling phase; it no longer shifts during the hold phase.

The sampling phase is defined by a sampling signal HE; this signal at the high logic level during the sampling phase. During this phase, a current switch comprising notably a transistor T4 applies to the emitter of the follower transistor T3 a current originating from a current source SC2 whose value is preferably $I_0$. The base of the transistor T4 is controlled by the sampling signal HE. The transistor T4 is on during the sampling phase. The logical complement of the signal HE is denoted HEN, at the low level when HE is at the high level and vice versa; the signal HEN controls the base of a transistor T7 which forms part of the current switch; it turns on this transistor T7 outside of the sampling phase so as to divert out of the transistor T4, and therefore out of the follower transistor T3, the current of the source SC2.

A second current switch comprises transistors T5 and T6 and is controlled by a hold signal HB defining the hold phase, and by a signal HBN complementary to the hold signal. The base of the transistor T5 receives the hold signal HB; this transistor is turned on during the hold phase. It tends to lower the base potential of the transistor T3 so as to prevent it from turning on. The base of the transistor T6 receives the complementary signal HBN which turns on this transistor outside of the hold phase so as to cause the current of the source SC1 to flow in the differential pair T1, T2.

Furthermore, in this example there is provision for a circuit for monitoring and maintaining the base potential of T3 during the hold phase. This circuit CLMP comprises a level offset circuit DN and a transistor T8. This circuit receives on its input the voltage $V_{ech}$ stored on the storage capacitor $C_{ech}$ and it produces on the base of the follower transistor T3 a voltage which copies over the voltage $V_{ech}$ and which is such that the difference between the emitter voltage of T3 ($V_{ech}$) and the base voltage of T3 is close to zero, ensuring the disabling of T3 without excess negative voltage on the base of T3.

The output voltage of the sampler is taken on the storage capacitor, optionally through a buffer amplifier AMP.

Figure 2:
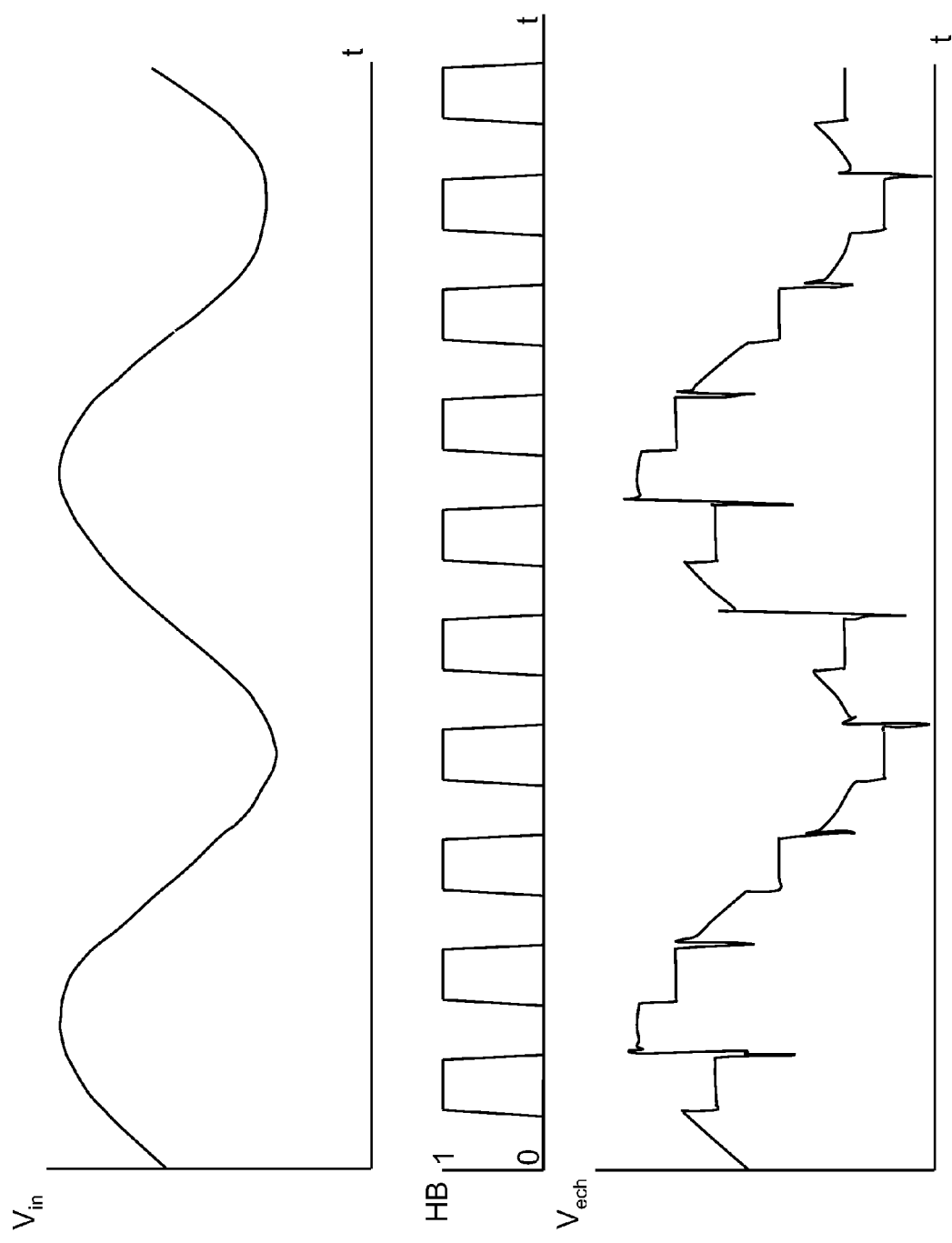
FIG. 2 represents an operating chart of the sampler of FIG. 1.
Figure 4:
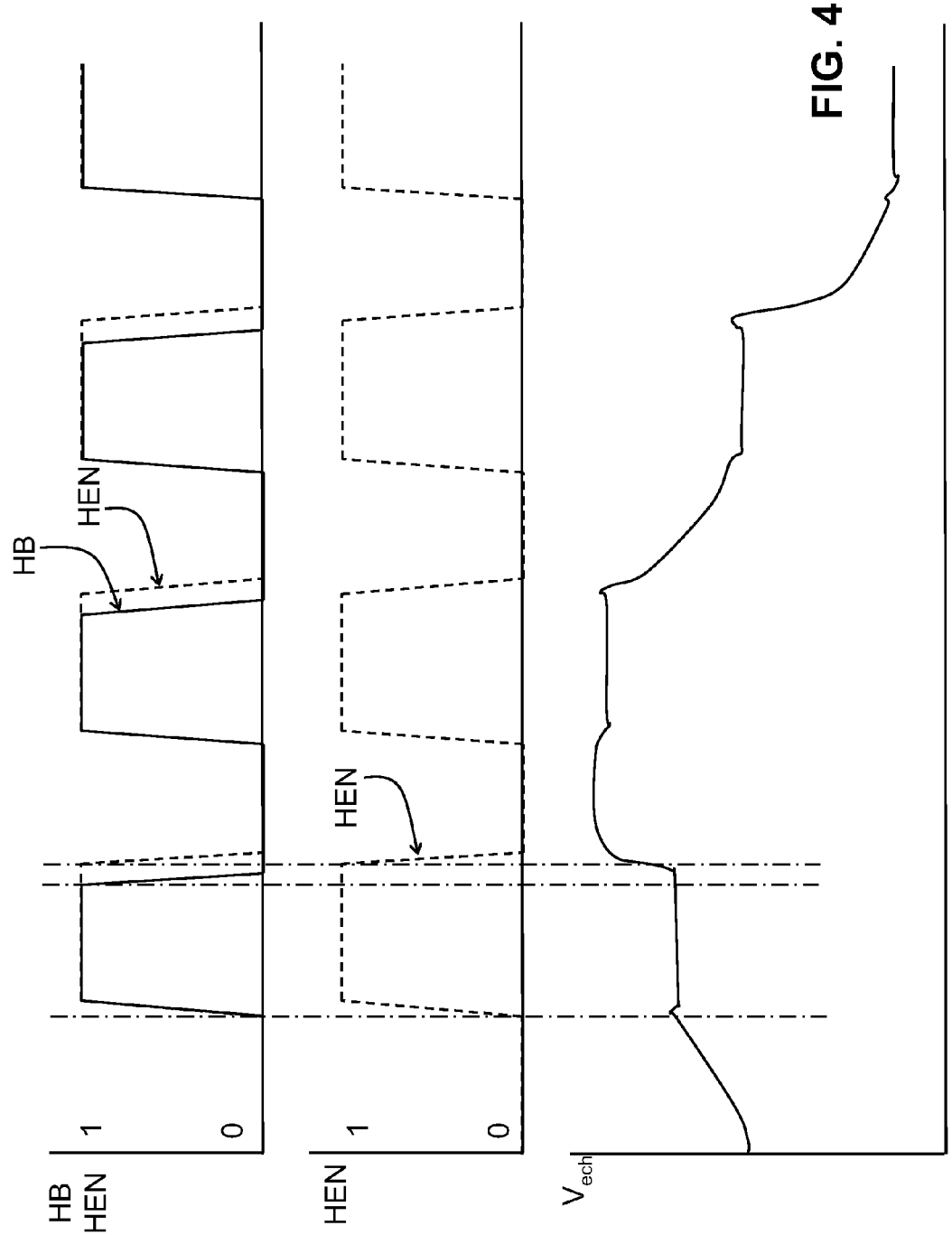
FIG. 4 represents an operating chart of the sampler of FIG. 3.

The hold signal HB and sampling signal HE are not exactly complementary; they are represented in FIG. 4. The scale is expanded with respect to the signals represented in FIG. 2 so as to better show the temporal offset according to the invention, between HB and HE. In the upper part of the figure have been represented at one and the same time the signals HEN (complement of HE) and HB. In the central part has been represented the signal HEN only. The rising edge is the same for the two signals HB and HEN. But their falling edges are slightly offset, the falling edge of the hold signal HB slightly preceding the falling edge of the complement HEN of the sampling signal HE.

In the lower part of FIG. 4 has been represented the sampling voltage $V_{ech}$. It is seen that the large switching spikes which appeared in FIG. 2 have practically disappeared in FIG. 4.

This results from the fact that the transistor T2 begins to conduct right from the end of the hold phase (falling edge of HB) as a consequence of the turning on of the transistor T6, this occurring before the sampling phase proper, that is to say before the transistor T4 begins to conduct. The base of T2 tends to take the value $V_{in}$ although T3 is still off. When the sampling signal arrives, the transistor begins to conduct but its base is almost at the level of potential which is appropriate for the sampling phase.

It will be noted that during the hold phase the isolation between the input and the sampling capacitor is particularly effective with the circuit according to the invention.

Figure 5:
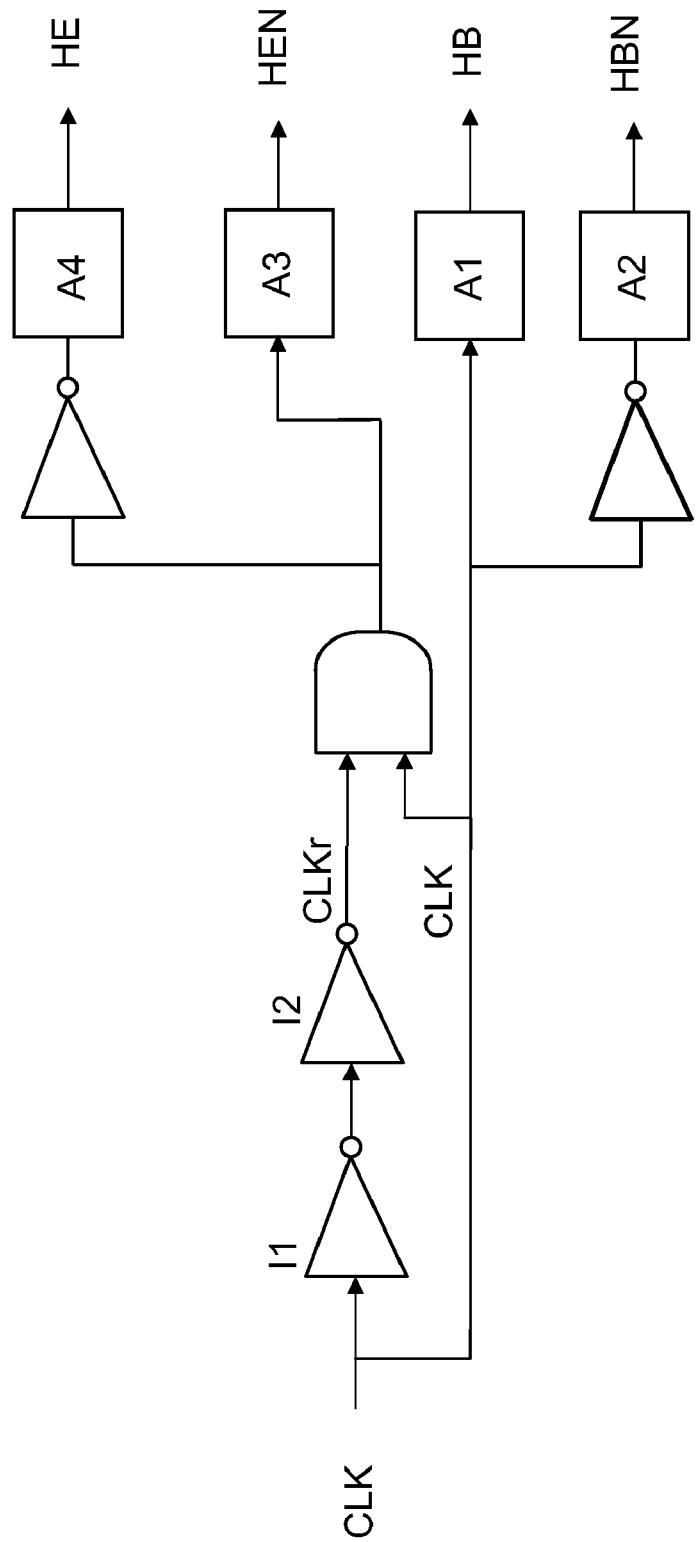
FIG. 5 represents a circuit for establishing hold and sampling signals on the basis of a common clock CLK.

FIG. 5 represents an exemplary way of achieving hold and sampling signals HB and HE and their complements on the basis of a single clock CLK. Two cascade inverters I1, I2 receive the clock CLK and produce a slightly delayed clock CLKr. The clock CLK and the delayed clock CLKr are applied to the input of an OR gate. The output of the OR gate produces a signal whose rising edge is the same as the rising edge of CLK and whose falling edge is the same as the falling edge of CLKr. The clock CLK serves to produce the hold signal HB (through a buffer amplifier A1) and its complement HBN (through an inverter and a buffer amplifier A2). The output of the OR gate serves to produce the sampling signal HE (through an inverter and a buffer amplifier A4) and its complement HEN (through a buffer amplifier A3).

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A sample-and-hold module comprising:
   a first differential pair of transistors constituting a unit-gain amplifier having an input for receiving an input voltage to be sampled and an output, the first differential pair of transistors being configured to be selectively supplied with current from a first current source;
   a follower transistor connected between the output of the first differential pair of transistors and a storage capacitor, the follower transistor having an emitter and a base and being configured to be selectively supplied with current from a second current source;
   a first current switch coupled between the follower transistor and the second current source and configured to cause the follower transistor to be turned on during a sampling phase by the application of the current from the second current source;

a second current switch coupled between the first differential pair of transistors and the first current source and being configured to steer the current from the first current source either towards the base of the follower transistor during a hold phase for applying a disabling voltage to the base of the follower transistor, or towards the first differential pair of transistors during a period other than the hold phase; and a signal generation circuit configured to generate a hold signal and a complementary hold signal for defining the hold phase and controlling the second current switch, and to generate a sampling signal and a complementary sampling signal for defining the sampling phase and controlling the first current switch, and for at least one sample-and-hold cycle, a beginning of the sampling phase occurring at a delayed time after an end of the hold phase of a previous sample-and-hold cycle.

2. The sample-and-hold module as claimed in claim 1, wherein, for the at least one sample-and-hold cycle, the hold signal has a rising edge occurring at the same time as a falling edge of the sampling signal of the at least one sample-and-hold cycle and a falling edge occurring before the occurrence of a raising edge of the sampling signal of a next sample-and-hold cycle.

3. The sample-and-hold module as claimed in claim 1, wherein the first differential pair of transistors further comprises a third transistor having a base configured for receiving the input voltage to be sampled and a fourth transistor having a base and a collector connected to the base of the fourth transistor, the connected base and collector of the fourth transistor defining the output of the first differential pair of transistors.

4. The sample-and-hold module as claimed in claim 3, wherein the second current switch comprises a third differential pair of transistors coupled to the first current source, one of the transistors of the third differential pair of transistors being coupled to the base of the follower transistor and being turned on by the hold signal defining the hold phase, and the other transistor of the third differential pair of transistors being coupled to the first differential pair of transistors so as to selectively couple the first differential pair of transistors with the first current source and being turned on by the complementary hold signal.

5. The sample-and-hold module as claimed in claim 1, further comprising a hold maintaining circuit having an input connected to the storage capacitor and an output connected to the base of the follower transistor, the hold maintaining circuit being configured to supply a base voltage to the base of the follower transistor lower than a voltage present on the storage capacitor.

6. The sample-and-hold module as claimed in claim 2, wherein the first differential pair of transistors further comprises a third transistor having a base configured for the input voltage to be sampled and a fourth transistor having a base and a collector connected to the base of the fourth transistor, the connected base and collector of the fourth transistor defining the output of the first differential pair of transistors, linked to the base of the follower transistor.

7. The sample-and-hold module as claimed in claim 6, wherein the second current switch comprises a third differential pair of transistors coupled to the first current source, one of the transistors of the third differential pair of transistors being coupled to the base of the follower transistor and being turned on by the hold signal defining the hold phase, and the other transistor of the third differential pair of transistors being coupled to the first differential pair of transistors so as to selectively couple the first differential pair of transistors with the first current source and being turned on by the complementary hold signal.

8. The sample-and-hold module as claimed in claim 2, further comprising a hold maintaining circuit having an input connected to the storage capacitor and an output connected to the base of the follower transistor, the hold maintaining circuit being configured to supply a base voltage to the base of the follower transistor lower than a voltage present on the storage capacitor.

9. The sample-and-hold module as claimed in claim 3, further comprising a hold maintaining circuit having an input connected to the storage capacitor and an output connected to the base of the follower transistor, the hold maintaining circuit being configured to supply a base voltage to the base of the follower transistor lower than a voltage present on the storage capacitor.

10. The sample-and-hold module as claimed in claim 4, further comprising a hold maintaining circuit having an input connected to the storage capacitor and an output connected to the base of the follower transistor, the hold maintaining circuit being configured to supply a base voltage to the base of the follower transistor lower than a voltage present on the storage capacitor.

* * * * *